US 11,322,283 B2

(12) United States Patent
Ferrarini et al.

(10) Patent No.: US 11,322,283 B2
(45) Date of Patent: May 3, 2022

(54) DIAGNOSTIC DEVICE AND METHOD FOR SOLENOID VALVES

(71) Applicant: CAMOZZI AUTOMATION S.P.A., Brescia (IT)

(72) Inventors: Dario Ferrarini, Brescia (IT); Andrea Camisani, Brescia (IT)

(73) Assignee: CAMOZZI AUTOMATION S.P.A., Brescia (IT)

( * ) Notice: Subject to any disclaimer, the term of this patent is extended or adjusted under 35 U.S.C. 154(b) by 201 days.

(21) Appl. No.: 16/631,495

(22) PCT Filed: Aug. 28, 2018

(86) PCT No.: PCT/IB2018/056550
§ 371 (c)(1),
(2) Date: Jan. 16, 2020

(87) PCT Pub. No.: WO2019/043572
PCT Pub. Date: Mar. 7, 2019

(65) Prior Publication Data
US 2021/0404577 A1 Dec. 30, 2021

(30) Foreign Application Priority Data
Aug. 29, 2017 (IT) .......................... 102017000096969

(51) Int. Cl.
*F16K 37/00* (2006.01)
*H01F 7/18* (2006.01)
(Continued)

(52) U.S. Cl.
CPC ....... *H01F 7/1844* (2013.01); *F16K 31/0675* (2013.01); *F16K 37/0083* (2013.01);
(Continued)

(58) Field of Classification Search
CPC ............. F16K 31/0675; F16K 37/0083; F16K 37/0091; Y10T 137/8158; Y10T 137/8326
(Continued)

(56) References Cited

U.S. PATENT DOCUMENTS 5,085,576 A * 2/1992 Bonne ..................... F23N 5/242
431/22
5,506,564 A * 4/1996 Hargest ............... B60R 16/0232
137/386
(Continued)

FOREIGN PATENT DOCUMENTS

| DE | 3807278 A1 | 9/1989 |
|---|---|---|
| DE | 102015206739 A1 | 10/2016 |
| EP | 2551684 A1 | 1/2013 |

OTHER PUBLICATIONS

International Search Report and Written Opinion for International Patent Application No. PCT/IB2018/056550, dated Dec. 20, 2018, 13 pages.

*Primary Examiner* — Matthew W Jellett
(74) *Attorney, Agent, or Firm* — Armstrong Teasdale LLP

(57) ABSTRACT

A diagnostic method for diagnosing a malfunction of a solenoid valve includes: a) storing reference features of a solenoid current waveform, b) detecting features of the solenoid current waveform during operation of the solenoid valve, c) comparing the reference features with the detected features, d) comparing the pressure value of fluid entering the solenoid valve inlet orifice with a predetermined range of pressure values in the event of deviation between the value of the detected features and the value of the reference features, e) adjusting the pressure value and repeating steps b) and c) in the case of deviation of the pressure value with respect to the pressure value range, and f) generating an alarm signal due to malfunction of the solenoid valve in the event of a deviation between the value of the detected (Continued)

features and the value of the reference and fluid pressure features within the pressure value range.

18 Claims, 9 Drawing Sheets

(51) Int. Cl.
*F16K 31/06* (2006.01)
*G01R 31/72* (2020.01)

(52) U.S. Cl.
CPC .......... *F16K 37/0091* (2013.01); *G01R 31/72* (2020.01); *Y10T 137/8158* (2015.04)

(58) Field of Classification Search
USPC ........................................ 251/129.04, 129.15
See application file for complete search history.

(56) References Cited

U.S. PATENT DOCUMENTS

| | | | | |
|---|---|---|---|---|
| 6,854,707 B2* | 2/2005 | Miyazoe | .................. | H01F 5/04 |
| | | | | 251/129.15 |
| 2006/0113836 A1* | 6/2006 | Nakamura | ................ | B60T 8/36 |
| | | | | 303/122.04 |

* cited by examiner

DIAGNOSTIC DEVICE AND METHOD FOR SOLENOID VALVES

CROSS-REFERENCE TO RELATED APPLICATIONS

This application is a National Phase filing of PCT International Application No. PCT/IB2018/056550, having an International Filing Date of Aug. 28, 2018, claiming the benefit of priority to Italian Patent Application No. 102017000096969, having a filing date of Aug. 29, 2017, each of which is hereby incorporated by reference in its entirety.

FIELD OF THE INVENTION

The present invention relates to a diagnostic device for solenoid valves.

BACKGROUND OF THE INVENTION

As illustrated in the example in FIG. 1, a solenoid valve 1 typically consists of an electromagnet 10 and a valve body 12, in which one or more orifices are formed.

SUMMARY OF THE INVENTION

The electromagnet 10 comprises a solenoid 102 in which a movable core 104 of ferromagnetic material is placed and slidable. The flow through an orifice of a fluid intercepted by the solenoid valve, for example compressed air, is blocked or allowed by the movement of the movable core 104 when the solenoid is electrically powered or is deactivated.

When the solenoid 102 is supplied, the movable core 104 directly opens the orifice of a normally closed (NC) valve or closes the orifice of a normally open (NO) valve. When the solenoid is deactivated, a spring 106 returns the core to its original position.

The valve operates in a pressure range of between 0 bar and the maximum nominal pressure. The force required to open the valve is proportional to the orifice section and the fluid pressure.

In the pneumatic field for industrial automation, the performance of pneumatic components is always more demanding and must be guaranteed over time. In some applications, the pneumatic components must be replaced as soon as a decrease in performance is detected.

In particular, the need to monitor the behavior of the solenoid valves to detect possible malfunctions or a significant reduction in their performance is increasingly felt.

The object of the present invention is to meet this need by providing a diagnostic device capable of monitoring the performance of a solenoid valve to detect a deviation from the expected values, for example due to a malfunction or due to wear degradation.

Another object of the invention is to propose a diagnostic device that can also provide an indication of a possible cause of a solenoid valve malfunction.

Another object of the invention is to propose a diagnostic device suitable for being implemented directly on a solenoid valve, also—when possible—as an accessory to be applied to an existing solenoid valve.

These and other objects and advantages of the invention are achieved with the diagnostic method, the diagnostic device and the solenoid valve described and claimed herein. The dependent claims describe preferred embodiments of the invention.

According to an aspect of the invention, the diagnostic method comprises the steps of:

a) storing in a non-volatile memory register the reference features of the waveform of the solenoid current,
b) detecting the features of the waveform of the solenoid current during the operation of the solenoid valve;
c) comparing the reference features with the detected features;
d) in the event of a deviation between the value of the detected features and the value of the reference features, generating an alarm signal for malfunction of the solenoid valve.

In one embodiment, before the alarm signal is generated, the value of the fluid pressure entering the solenoid valve inlet orifice is compared to a predetermined pressure range; in the event of a deviation of the pressure value with respect to said predetermined pressure value range, the pressure value is adjusted and steps b) and c) are repeated. In this case, the alarm is generated in the event of a deviation between the value of the features detected and the value of the reference and fluid pressure features within the range of predetermined pressure values.

In one embodiment, the features of the waveform of the solenoid current that are stored and compared are the slope of a first waveform section between the instant of excitation of the solenoid valve and the first current peak generated by the engagement of the mobile core and the slope of the second waveform section between the current peak and the next minimum point of the value of the solenoid current.

In one embodiment, the features of the solenoid current waveform comprise at least the first time interval that elapses between the instant of excitation of the solenoid and the instant of the current peak generated by the engagement of the movable core.

For example, this first time interval is obtained by means of an analog peak detection circuit which compares the value of the instantaneous solenoid current with the value of the solenoid current to which a predetermined delay is applied.

In an embodiment variant, this first time interval is obtained by means of a digital circuit for sampling the waveform of the solenoid current.

According to an aspect of the invention, the reference features are features of the solenoid current waveform acquired when the solenoid valve is in a test phase during or after release from the factory.

In a variant embodiment, the reference features are features of the waveform of the solenoid current obtained from average values relative to a set of values previously acquired.

According to an aspect of the invention, the diagnostic device for diagnosing a malfunction of a solenoid valve comprises an electronic microcontroller diagnostic circuit configured to implement the diagnostic method described above.

Preferably, the diagnostic circuit is implemented on a power supply and control circuit board suitable to be mounted on the solenoid valve.

According to an aspect of the invention, the diagnostic device comprises communication means suitable to implement communication between the microcontroller of the electronic diagnostic circuit and an external control unit.

For example, the communication means are suitable to transmit a status signal to the external control unit, which may assume at least two logical levels representative of the operational state of the solenoid valve.

In one embodiment, the electronic diagnostic circuit comprises a current sampling circuit suitable to sample the waveform at predetermined time intervals.

In an embodiment variant, the electronic diagnostic circuit comprises an analog peak detection circuit comprising an operational amplifier with comparator function the inverting input terminal of which receives the solenoid current detected through a shunt resistor and the non-inverting input terminal of which receives the solenoid current to which is applied a delay given by an RC network.

Moreover, a solenoid valve comprising a diagnostic device as described above constitutes an object of the invention.

In one embodiment, the solenoid valve according to the preceding claim, comprising a power supply and control circuit board, the diagnostic device being implemented on such a power supply and control circuit board.

In one embodiment, the power supply and control circuit board is provided with an electrical connector having a pair of power supply terminals and an electrical diagnostic terminal connectable to an external control unit.

BRIEF DESCRIPTION OF THE DRAWINGS

Further features and the advantages of diagnostic device and method according to the invention shall be made readily apparent from the following description of preferred embodiments thereof, provided purely by way of a non-limiting example, with reference to the accompanying figures, in which.

DETAILED DESCRIPTION

Figure 1:
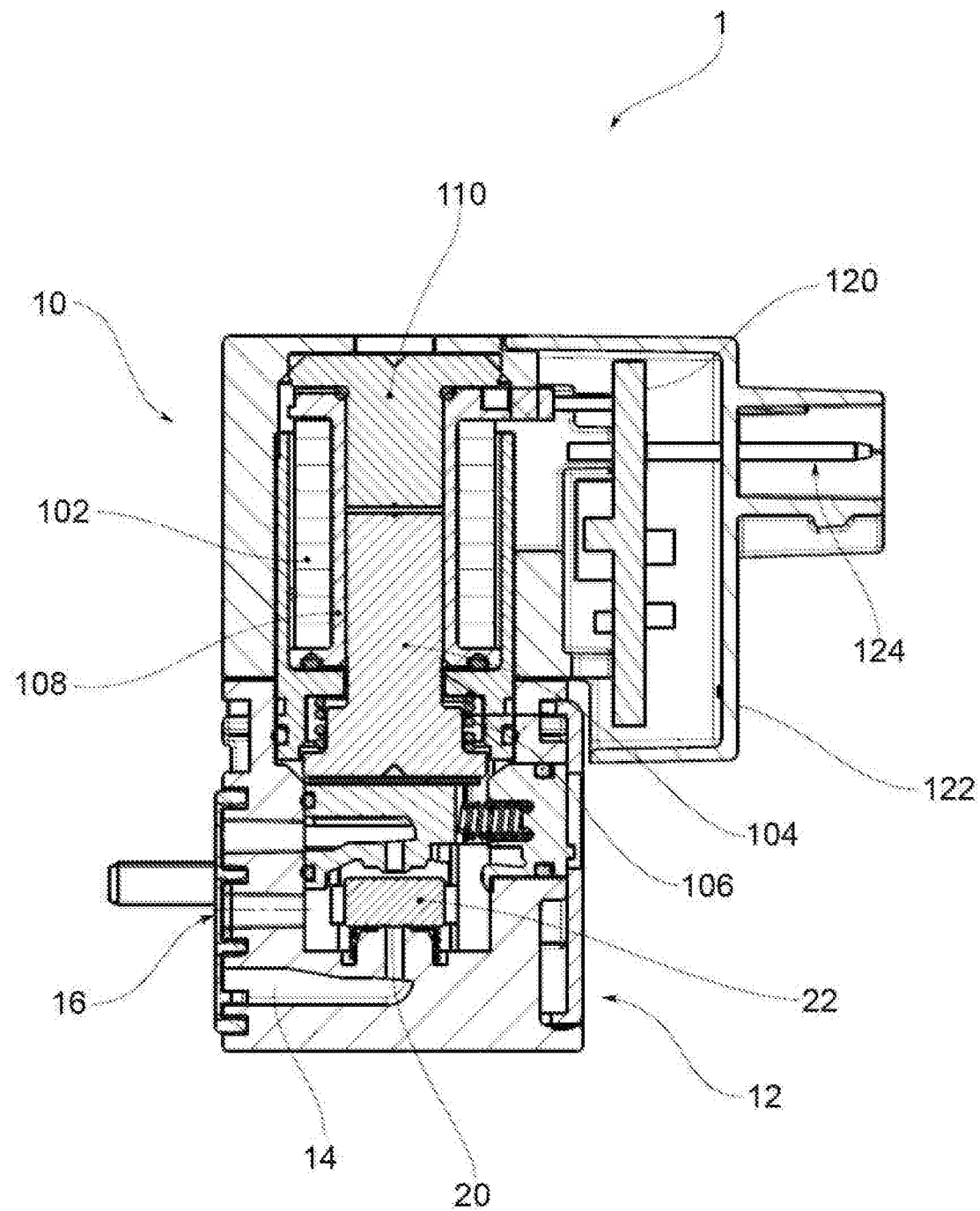
FIG. 1 is a sectional view of a solenoid valve according to the prior art.
Figure 2:
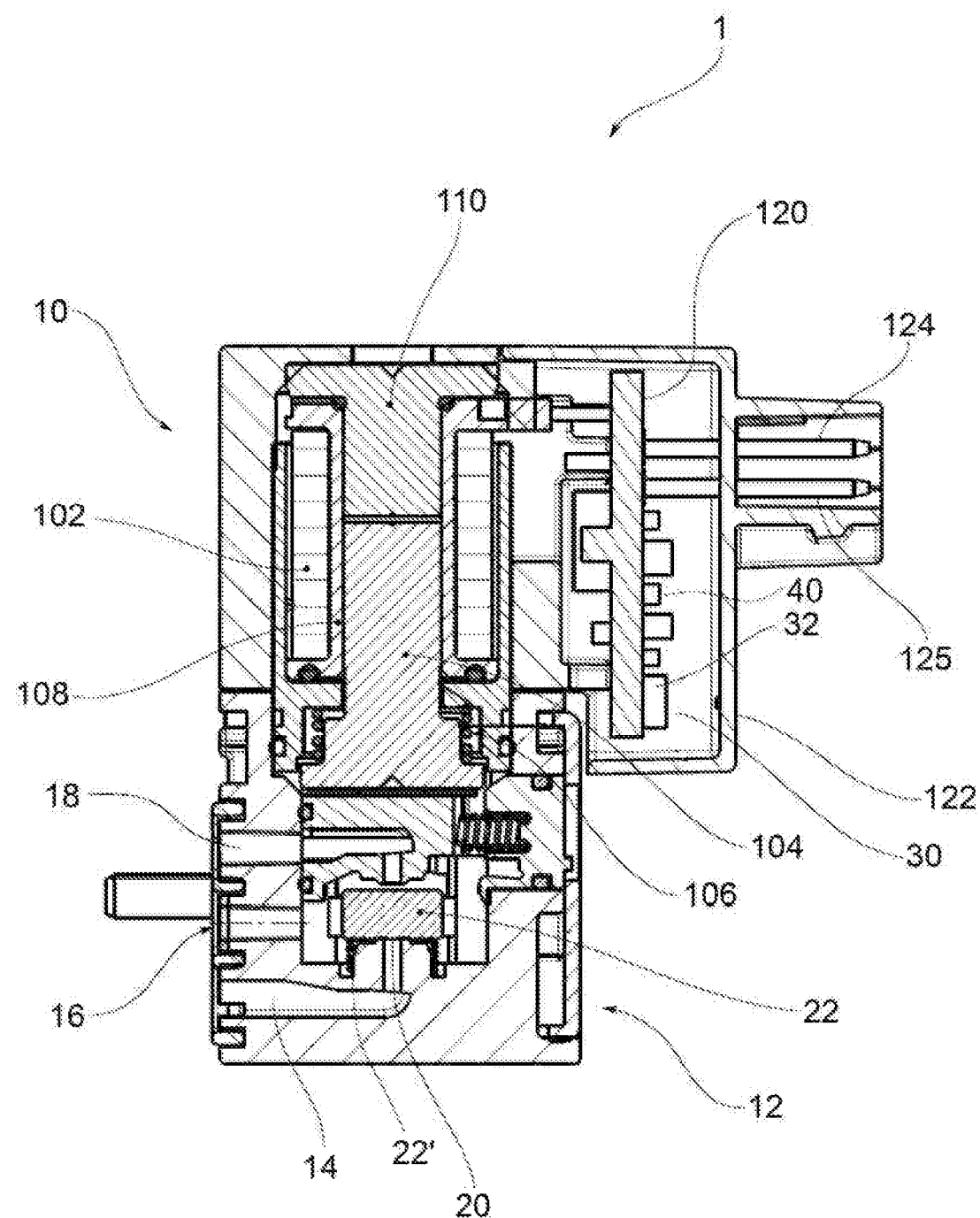
FIG. 2 is a sectional view of a solenoid valve provided with a diagnostic device according to the invention.

FIG. 2 shows a solenoid valve 1 provided with a diagnostic device according to the invention.

The solenoid valve 1 comprises an electromagnet 10 and a valve body 12 in which an inlet orifice 14, an outlet orifice 16 and an exhaust passage 18 are formed.

The inlet orifice 14 forms a valve seat 20 which is associated with a sealing valve element 22 movable between a closed position and an open position of the valve seat 20.

The electromagnet 10 comprises a solenoid 102 wound on a spool 108 and a magnetic circuit formed by a fixed armature 110, having for example a portion which partially penetrates into the axial sleeve of the spool 108, and a movable core 104, which also penetrates partially in the sleeve.

The sealing valve element 22 can be constructed integrally with the movable core 104 or as a separate element. In some embodiments, the sealing valve element 22 has a cylindrical shaped base, with comb teeth facing the movable core.

If the valve element is made as a separate element—as in the example in FIG. 2—a spring 22', placed under the cylindrical base thereof, has the task of pushing it towards the movable core 104 as the position of the latter changes.

The solenoid 102 has a pair of electrical terminals connected to an electronic power supply and control circuit board 120 housed in a protective casing 122 integral with the electromagnet 10. In turn, the electronic power supply and control circuit board 120 is provided with power terminals 124 suitable for being connected to a power connector.

According to an aspect of the invention, the diagnostic device comprises an electrical diagnostic circuit 30 implemented on the electronic power supply and control circuit board 120.

In a DC valve of the type described above, supplied with a constant supply voltage, for example 24V, 12V, or 5V, as soon as the solenoid 102 is energized, the current in the solenoid increases, causing expansion of the magnetic field until it becomes high enough to move the movable core 104. The movement of the movable core 104 increases the concentration of the magnetic field, since the magnetic mass of the core moves more and more inside the magnetic field.

Figure 3:
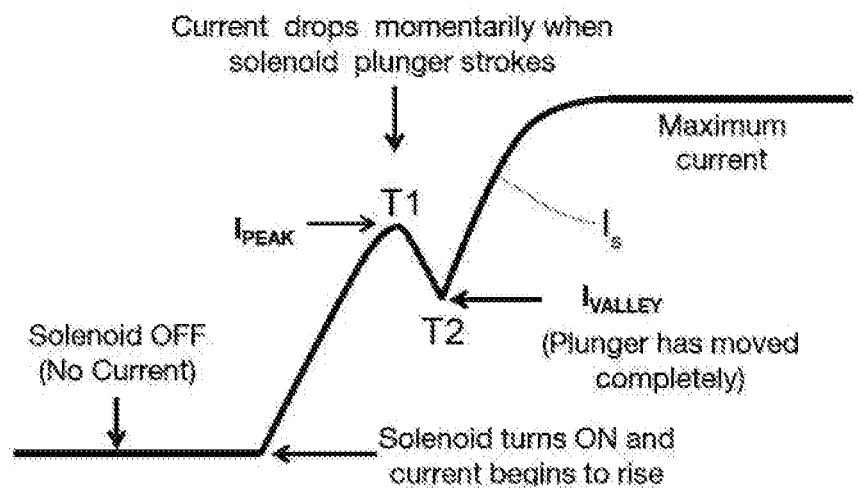
FIG. 3 is a graph representing a typical waveform of the solenoid current.

A magnetic field, which changes in the same direction as the current that generates it, induces a voltage of opposite sign in the turns of the solenoid. Since the magnetic field expands rapidly as the movable core moves to the end-of-travel position, this field causes a brief reduction in the current flowing in the solenoid winding. After the movable core has reached the end of its stroke, the current resumes to increase up to its maximum level. A typical waveform of the solenoid current IS is shown in FIG. 3.

As long as no supply voltage is applied to the solenoid, the solenoid current is zero.

When the solenoid is supplied, there is a first increase of the solenoid current IS, until a peak value IPEAK is reached, at the time T1, which, as said, corresponds to the engagement of the movable core, or at the beginning of its stroke towards the fixed armature. The solenoid current then undergoes a decrease until the attainment, at the instant T2, of a minimum value IVALLEY, which corresponds to the abutment of the movable core against the fixed armature. At this point, the solenoid current begins to grow until it reaches its maximum value.

The simplified solenoid equation of a solenoid valve could be represented as follows:

$$V = iR + d\Phi(i,x)/dt$$

where V is the voltage applied to the solenoid, R is the resistance of the solenoid and $\Phi$ expresses the variation of magnetic flux as a function of the current and position (x) of the mechanical moving parts (movable core and fixed core, or armature).

The first term of the equation relates to the variation of the resistance and the second term expresses the induced tension.

The solenoid inductance depends on the position of the moving parts, since the solenoid magnetic reluctance depends on the position of the electromagnetic parts and therefore on the closing of the magnetic field itself.

The flow Φ in the coil depends on the current flowing through the coil and on the distance of the ferrous parts, according to the formula:

$$V = IR + \frac{\delta \Phi (i, x)}{\delta i} * \frac{di}{dt} + \frac{\delta \Phi (i, x)}{\delta x} * \frac{dx}{dt}$$

Being Φ=Li, the previous relationship becomes:

$$V = IR + L(i, x) * \frac{di}{dt} + i * \frac{dL (i, x)}{dx} * \frac{di}{dt}$$

The third addendum represents the counter-electromotive force induced by the movement of the ferrous parts.

This relationship clearly shows that the magnetic flux and therefore the attractive force of the solenoid valve depend on the values of the resistance R and the inductance L of the solenoid.

It is also known that the resistance R of a solenoid is given by the relation $$R=\rho*l/S$$

where ρ is the average resistivity of the material, l is the length of the wire and S is the section.

One can assume ρ and S as constants, while the length l is subject to thermal expansion, expressible as follows:

$$R=R(T0)*[l+\sigma(T-T0)]$$

where T0 is the temperature at 20° and σ is the thermal coefficient dependent on the material.

Returning now to the waveform of the solenoid current, it can be seen that this waveform is substantially independent of temperature.

On the contrary, it has been found that the waveform of the solenoid current, and in particular the time interval T1 between the excitation of the solenoid and the peak of current IPEAK which precedes the temporary drop, depends on the pressure of the fluid in the inlet orifice and/or on the wear of the solenoid valve, which is reflected for example in deformations of the sealing valve element, loss of spring load, frictions.

Figure 4:
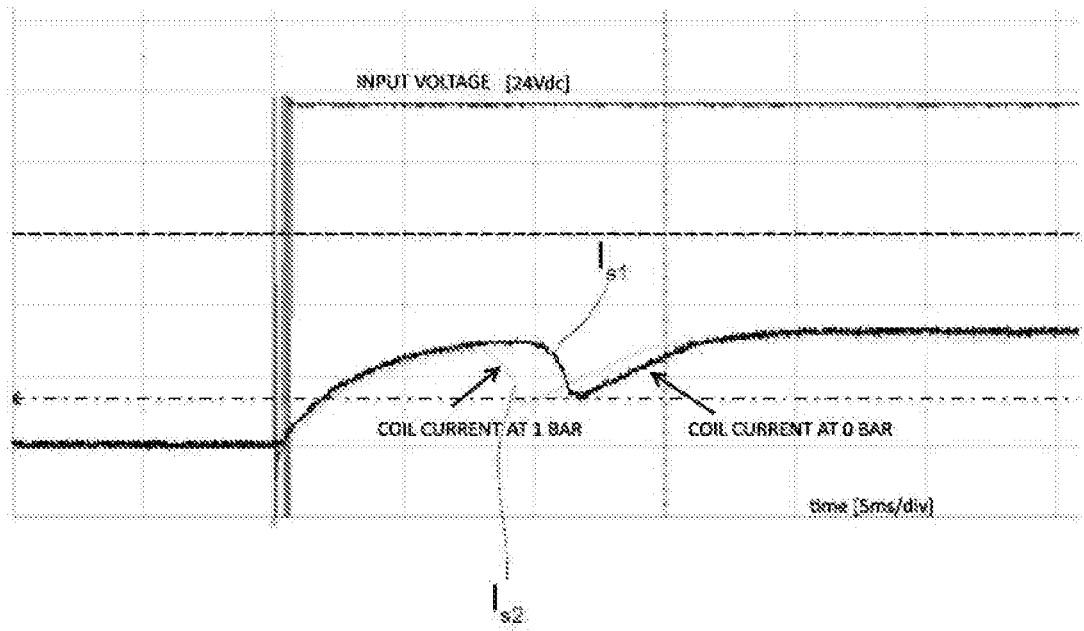
FIG. 4 shows, overlapping each other, the waveforms of the solenoid current with the solenoid valve at a pressure of 0 bar and a pressure of 1 bar.

For example, FIG. 4 shows the waveform of the solenoid current in the case of pressure at 0 bar (IS1) and in the case of pressure at 1 bar (IS2). Note that both the current peak IPEAK and the minimum value IVALLEY occur earlier in the case of higher pressure.

The idea underlying the present invention is therefore to store in a non-volatile memory register reference features of the waveform of the solenoid current, either predetermined or preacquired, to detect these features over time during the operation of the solenoid valve and to compare the reference features with the features detected so as to identify any deviations in the current solenoid current waveform with respect to the reference waveform.

In one embodiment, the reference features are features of the solenoid current waveform acquired when the solenoid valve is in a test phase during or after release from the factory, i.e. is at the beginning of its life cycle.

In a variant embodiment, the reference features are features of the waveform of the solenoid current obtained from average values relative to a set of values previously acquired, not necessarily the original set.

It should be noted that by detection of the solenoid current waveform features over time during the operation of the solenoid valve it is meant both a detection that is carried out at each excitation of the solenoid valve, and a detection which is carried out at intervals of time for monitoring the operation of the solenoid valve during its life cycle.

In the case of known and stabilized fluid pressure, for example from an external pressure control system to the solenoid valve, if the solenoid current waveform varies with respect to the reference waveform it can be said that the solenoid valve it is deteriorating.

If, on the other hand, the pressure is not stabilized and the waveform changes, the cause of waveform variation may be due either to a change in fluid pressure or to a deterioration of the solenoid valve.

In this situation, the diagnostic device can generate an alarm signal connected to a control unit, for example a PLC, which controls the fluid pressure so that it is stabilized. In this case, the diagnostic device can be controlled to repeat the comparison between the waveforms features to check whether the difference between the waveforms continues, which is indicative of a deterioration of the solenoid valve, or if it is not present anymore, which means that the solenoid valve works correctly and that the pressure must then be stabilized.

In one embodiment, the features of the waveform that are stored and compared are the slope of the first waveform section between the instant of excitation of the solenoid valve and the first current peak and the slope of the second waveform section between the current peak IPEAK and the next minimum point IVALLEY of the value of the solenoid current.

For example, the slope of the first section is determined by calculating the ratio between the duration of the first time interval T1 of the waveform, i.e. the time interval between the solenoid excitation instant and the current peak, and the difference between the current value at the current peak and the initial current, which corresponds to zero.

The slope of the second section is estimated by calculating the ratio between the duration of the second time interval (T2−T1) of the waveform, i.e. the time interval between the instant T1 in which the current peak occurs and the instant T2 in which the current minimum value is obtained, and the difference between the value of the current corresponding to the minimum value and the value of the current at the current peak.

In one embodiment, the solenoid current values are obtained by sampling the waveform at predetermined time intervals by means of a current sampling circuit.

Since in an advantageous embodiment, the diagnostic circuit 30 is implemented in the same electronic power supply and control circuit board 120 already provided on the solenoid valve, this diagnostic circuit must be optimized in terms of overall dimensions and therefore of the size and number of the electronic components. For example, the diagnostic circuit 30 comprises a microcontroller 32 whose computing power and the memory register are selected so as to be capable of being mounted on the power supply and control circuit board 120 without affecting the overall dimensions of the latter.

Therefore, even an existing solenoid valve can be provided with a diagnostic device simply by replacing the traditional power supply and control circuit board with a power supply, control and diagnostic board having the same dimensions as the first one.

For this purpose, in one embodiment, the microcontroller 32 compares each value of the sampled current received from the sampling circuit with the previous sampled current value and stores the sampled value in the memory register only if the result of the comparison reveals the achievement of the current peak or minimum current.

In a variant embodiment, the diagnostic circuit is suitable for carrying out the comparison only with the engagement time T1 of the movable core, i.e. the first time interval that elapses between the instant of excitation of the solenoid and the instant of the current peak.

Figure 5:
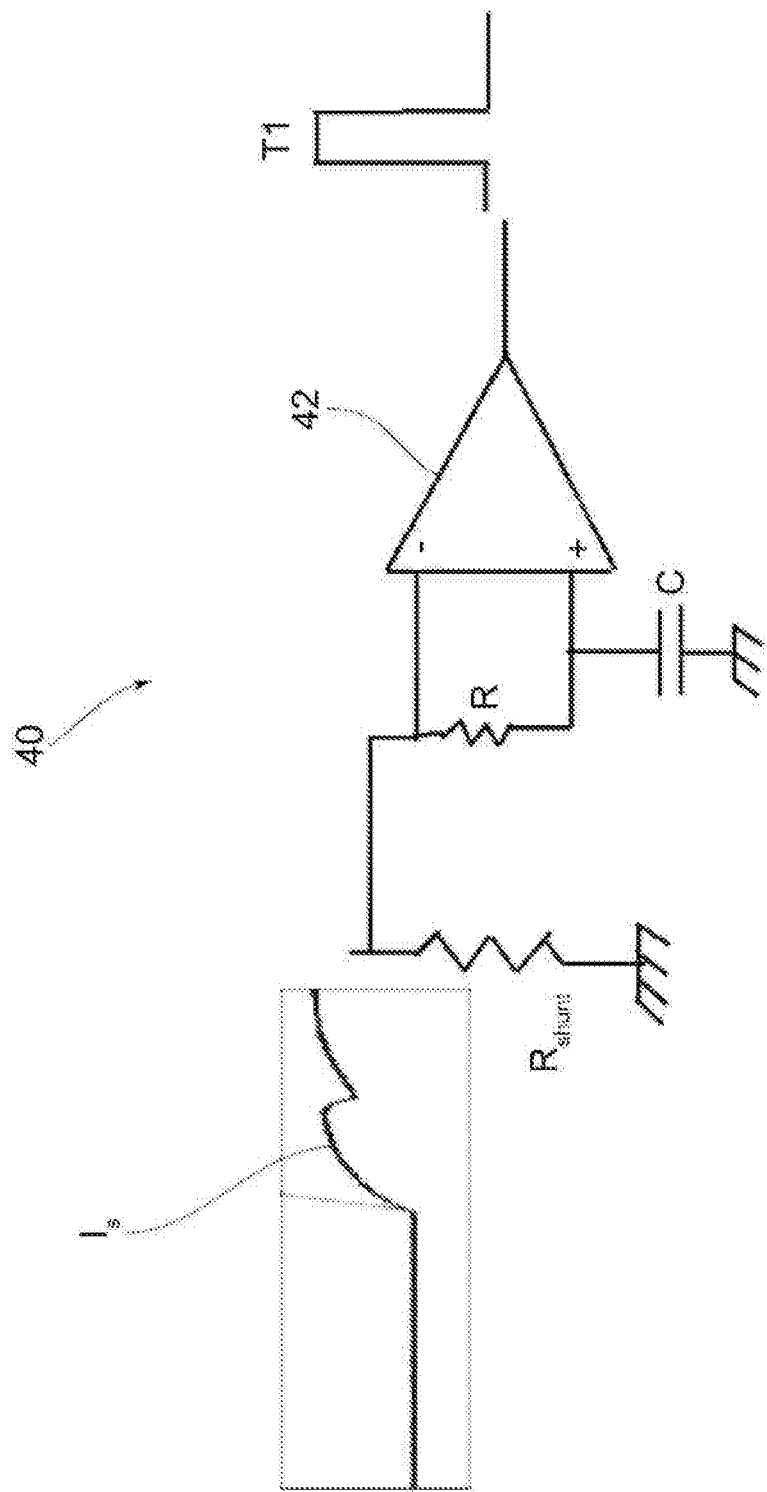
FIG. 5 is a circuit diagram of a circuit for measuring the current peak of the waveform of the solenoid current.

To detect this time interval, in one embodiment the diagnostic device comprises an analog peak detection circuit 40, such as that shown in FIG. 5. In this circuit, the solenoid current sensed through a shunt resistance RSHUNT (inverting input) and the solenoid current to which a delay given by an RC network is applied (non-inverting input) are brought to the input terminals of an operational amplifier 42 with comparator function. In this way, the circuit is capable of detecting the instant T1 in which the solenoid current reaches the peak value IPEAK.

In one embodiment, the detection of the features of the solenoid current waveform during the operation of the solenoid valve includes a verification of the variation in the slope of the current waveform between the current peak (instant T1) and the minimum current value (instant T2). In fact, it has been found that any variation in the slope of this section of the curve is particularly significant in terms of deterioration of the solenoid valve attributable to friction, being corresponding to the movement step of the movable core.

Figure 6:
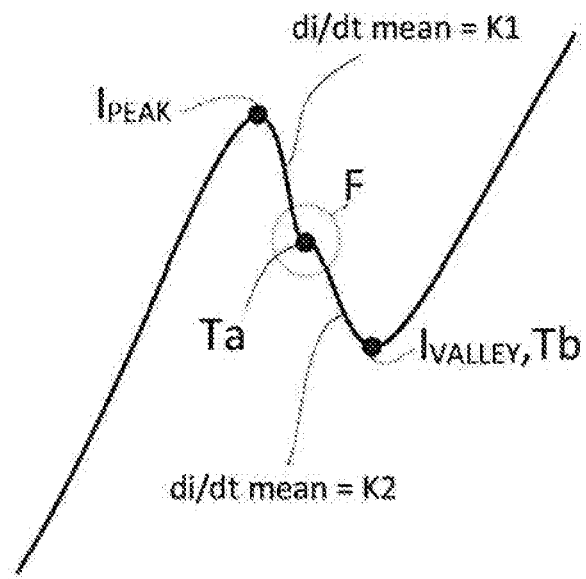
FIGS. 6 and 6a show two graphs of the waveform of the solenoid current in the presence of frictions between the movable core and the solenoid.
Figure 6A:
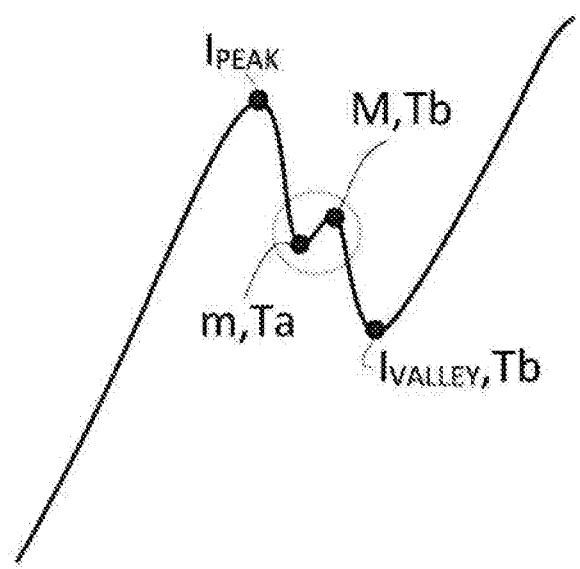

With reference to FIGS. 6 and 6a, by slope variation it is meant in particular the appearance of an inflection F (FIG. 6) or additional maximum (M) and minimum (m) relative points (FIG. 6a), as in the portions of waveforms highlighted in the drawings.

Figure 7:
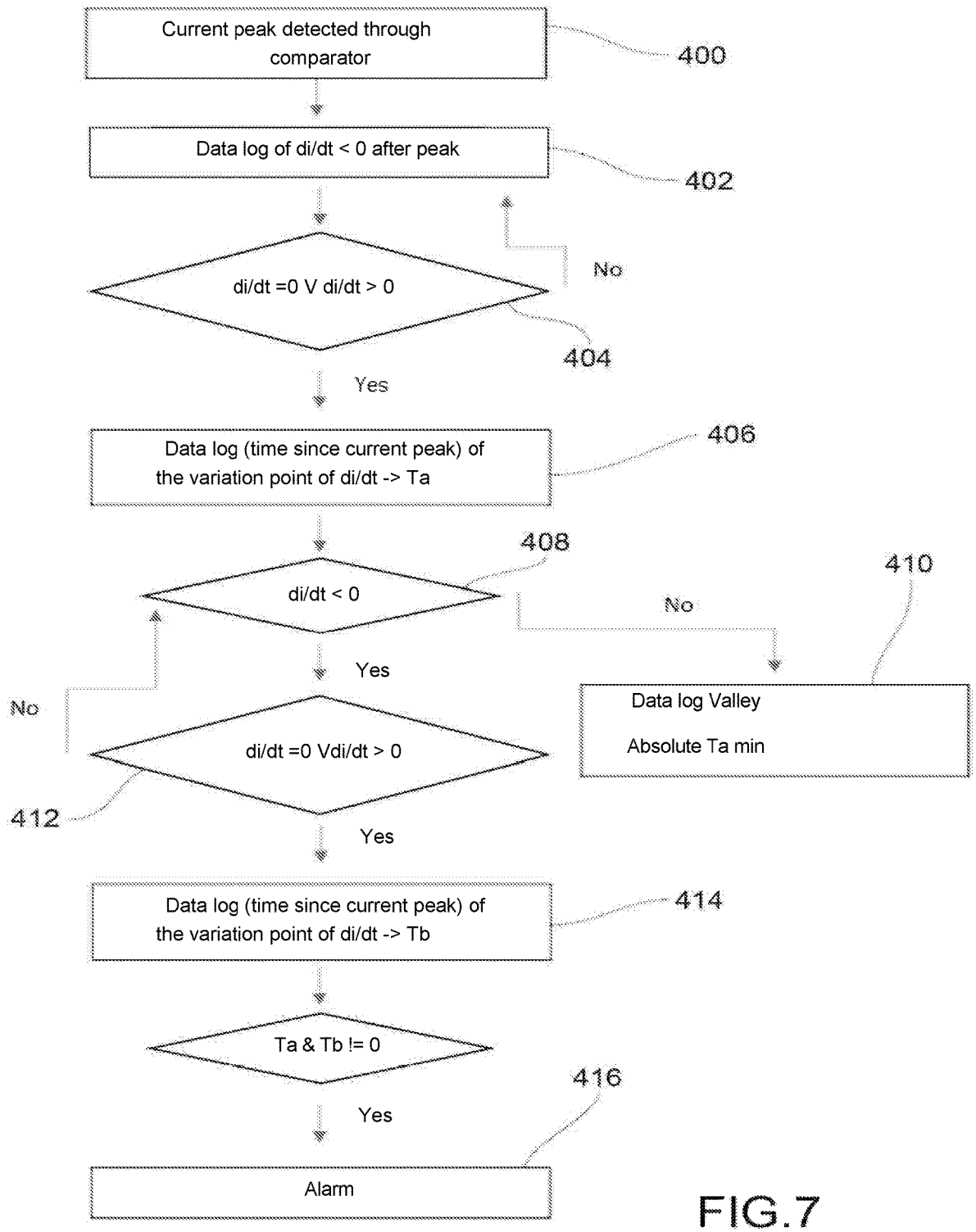
FIG. 7 is a flowchart of a diagnostic algorithm, in one embodiment.

An example of a diagnostic protocol for this embodiment is shown in the flowchart in FIG. 7.

With reference to the flowchart in FIG. 7, through the current peak detection circuit, for example through the comparator circuit, the current peak IPEAK is detected (step 400).

Following this detection, for example by sending a peak detect interrupt, the diagnostic circuit, for example by means of a microcontroller receiving the interrupt and through a sampling circuit of the voltage on the shunt, samples the current flowing in the solenoid, and in particular its variation rate Ka' over time (di/dt) (step 402).

In one embodiment, the value of this gradient Ka' is compared to a reference value Ka.

If the current gradient in the solenoid is negative, it means that the movable core continues in its movement with a dynamic proportional to the Ka' value of the gradient itself.

The derivative of the current over time (di/dt) is continuously calculated, sampling the current in a temporal range contiguous to that in which the waveform peak occurred.

In one embodiment, when a null or positive value of the current derivative (di/dt) occurs (step 404), the time value Ta corresponding to said detection is stored (step 406), for example by the microcontroller.

The calculation of the current derivative over time (di/dt) continues to determine whether the gradient remains negative (step 408).

In one embodiment, the average value of this derivative, in this observation step, can be stored in parameter Kb' and compared with a second reference value Kb.

If the gradient Kb' always remains positive, it means that the point of the waveform at the instant Ta previously detected was a point of absolute minimum, that is the point IVALLEY, and therefore the instant Ta coincides with the instant T2 (step 410).

In one embodiment, when a second null or positive value of the current derivative (di/dt) occurs (step 412), the time value Tb corresponding to said detection is stored (step 414) by the microcontroller It should be noted that the values of the time instants Ta, Tb and of the gradients Ka' and Kb' are initialized to zero upon each activation of the solenoid.

The simultaneous presence, after the detection of the current peak, of two non-zero values Ta and Tb and/or of at least a lower one of the values of the detected gradients Ka', Kb', in absolute value, at the respective reference value Ka, Kb indicates that during the movement of the movable core there has been a discontinuity in the dynamics of the displacement, due to frictions.

As far as the gradients Ka' and Kb' are concerned, in particular, a negative but lower value, in absolute value, than the predetermined values Ka, Kb indicates that the slope of the descending section of the curve is lower than a predetermined slope due to the presence of friction in the travel of the movable core.

The diagnostic circuit therefore generates an alarm signal (step 416).

As stated above, in one embodiment the diagnostic device is implemented on the electronic power supply and control circuit board 120 of the solenoid valve and is suitable for communicating with an external control unit, for example a PLC, using a communication protocol based on a single diagnostic cable 125, which becomes the third solenoid valve cable, in addition to the two power cables 124.

Figure 8:
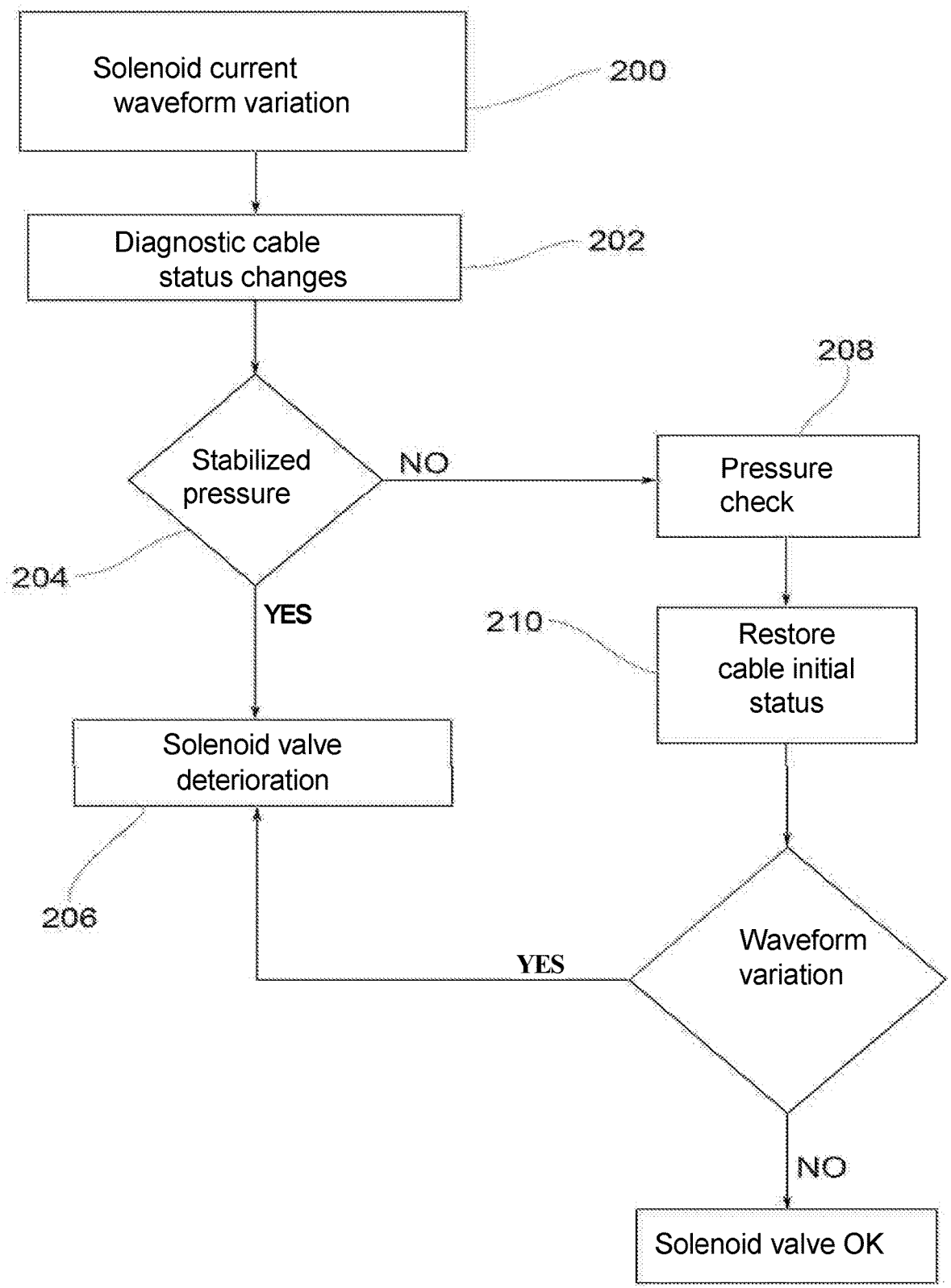
FIG. 8 is a flowchart of a diagnostic algorithm, in another embodiment.

An example of a diagnostic protocol between the solenoid valve diagnostic circuit and the PLC is shown in the flowchart in FIG. 8.

The diagnostic circuit detects a variation of the waveform of the solenoid current (step 200), for example by means of one of the detection modes described above; then, the diagnostic circuit changes the level of the diagnostic cable status, for example from low to high (step 202).

The PLC, receiving this alarm signal from the diagnostic circuit, checks whether the pressure is stable (step 204). If the PLC has information that the system pressure is stabilized, then an alarm signal is emitted relating to a deterioration of the solenoid valve (step 206).

If, on the other hand, the PLC does not have a stabilized system pressure information, then the PLC carries out a system pressure check (step 208) and controls the solenoid valve to reset the initial level of the diagnostic cable (step 210).

If, following the pressure check, the diagnostic circuit still detects a variation of the solenoid current waveform, then the diagnostic algorithm can conclude that the solenoid valve is deteriorating.

If, on the other hand, the waveform is within the parameters of the reference waveform, then the solenoid valve is operating correctly.

In some embodiments, pressure sensing may not be necessary, for example when several solenoid valves are supplied with the same fluid under pressure, as in the case of an island of solenoid valves, and only some have an anomaly in the waveform. In this case, in fact, it is highly probable that the cause of the different current waveforms is not a change in the input pressure but a wear or malfunction of some solenoid valves.

According to another aspect of the invention, the solenoid valve is provided with an electronic microcontroller-based diagnostic circuit capable of predicting a malfunction of the solenoid valve by monitoring the solenoid current, according to one of the above methods, and the supply voltage. Unlike other known diagnostic methods, no position sensor is required.

In one embodiment, the microcontroller of the electronic diagnostic circuit communicates with an external control unit, for example a PLC, through a single diagnostic cable which can take two or more logical levels.

In a preferred embodiment, the diagnostic electronic circuit 30 is implemented on the same electronic power supply and control circuit board 120 of the solenoid valve and is therefore supplied by the same power supply source that supplies the solenoid of the valve.

Figure 9:
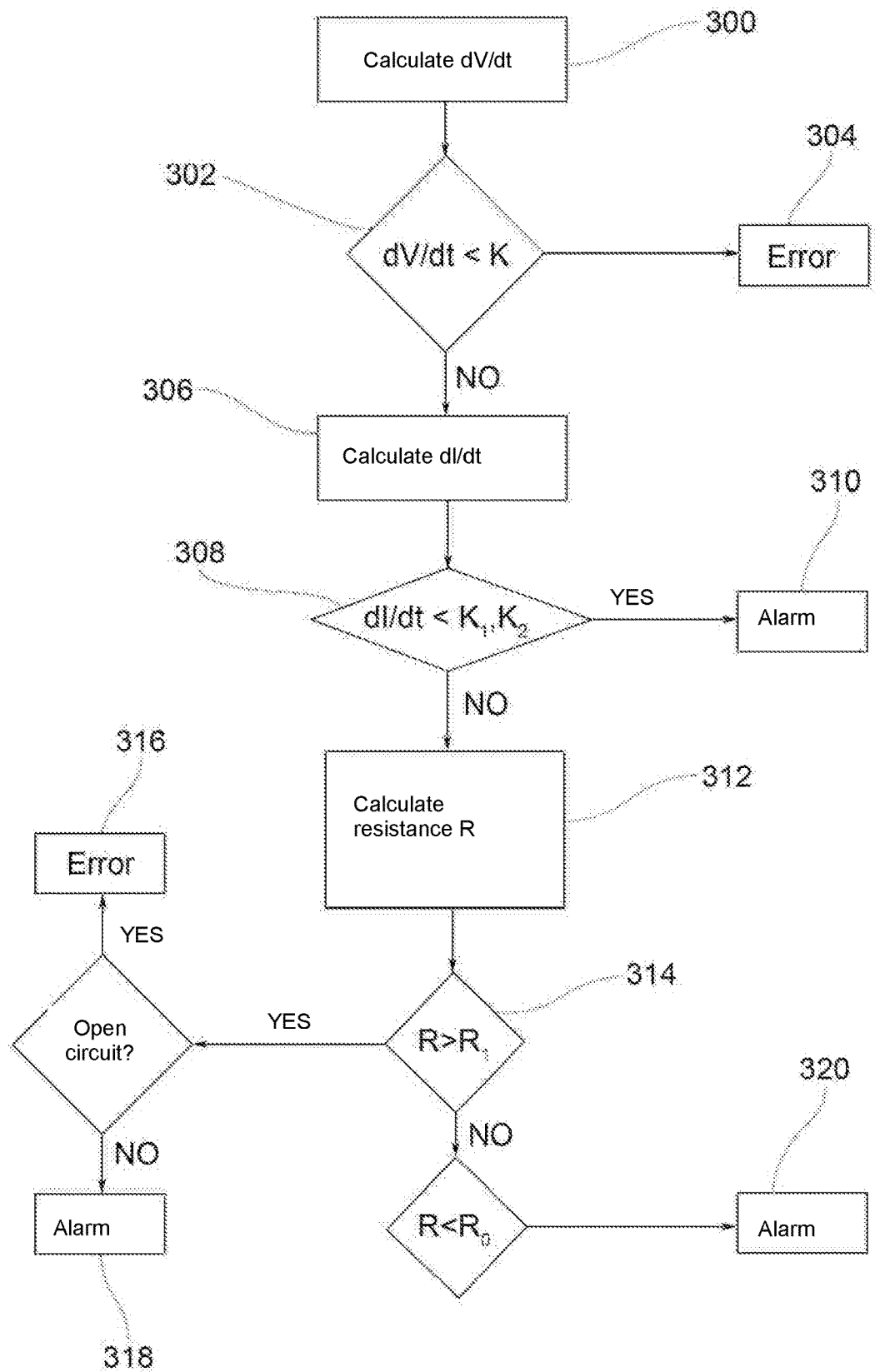
FIG. 9 is a flowchart of a diagnostic algorithm, in another embodiment.

With reference to the flowchart in FIG. 9, the microcontroller, upon switching on of the power supply and diagnostics circuit, samples, for example through a sampling circuit, the supply voltage on the solenoid, and in particular its rate of variation over time (dV/dt), to check whether it respects the predetermined pattern (step 300). This gradient is then compared to a predetermined value K (step 302).

If the supply voltage gradient is zero or is lower than the predetermined value K, it means that the solenoid is not supplied correctly, and an error signal is sent (step 304).

If, on the other hand, the solenoid is supplied correctly, the microcontroller detects the peak and the valley of the solenoid current waveform and calculates the derivative of the current over time (dI/dt) in a temporal range which includes or is contiguous to that where the waveform peak and the valley occur (step 306).

These derivatives, which represent the rate of variation of the solenoid current, are then compared with respective predetermined values K1, K2 (step 308). If the values of the derivatives are equal to zero (which indicates that the curve does not even have the descending section) or in any case lower than the respective predetermined values K1, K2 (which indicates that the slope of the descending section is too low due to friction in the stroke of the movable core), the microcontroller generates an alarm signal (step 310).

If the diagnostic microcontroller is connected, for example via a diagnostic cable, to an external control unit, for example a PLC, the alarm signal is sent to that unit and a pressure control algorithm can be started, as previously described with reference to the algorithm in FIG. 6. The PLC then checks whether the pressure is stable. If so, then the PLC or the diagnostic microcontroller generate an alarm signal relating to a deterioration of the solenoid valve.

If, on the other hand, the PLC does not have a stabilized system pressure information, then the PLC checks the system pressure and controls the solenoid valve diagnostic circuit to repeat the calculation of the variation rate of the solenoid current. If, following the pressure control, the diagnostic circuit still detects values of the current derivatives over time equal to zero or in any case lower than the respective predetermined values K1, K2, then the diagnostic algorithm can conclude that the solenoid valve is deteriorating. If, on the other hand, the values of the derivatives are equal to or higher than the predetermined values K1, K2, then the solenoid valve is operating correctly.

If, on the other hand, the diagnostic microcontroller is not connected to an external control unit, a visual indication of the anomalous operating status can be provided, for example by means of a flash at a certain frequency of a LED.

In one embodiment, the derivatives of the solenoid current waveform are compared with the value of the derivatives calculated in a solenoid valve test step during or after release from the factory, i.e. at the start of its life cycle, in order to detect any significant variations caused by the wear of the solenoid valve, as explained above.

In a variant embodiment, the derivatives of the waveform are compared with the values of the derivatives calculated in the previous excitation of the solenoid valve (or with average values relative to a certain number of previous excitations).

In a variant embodiment, to detect any variations in the waveform of the solenoid current, instead of calculating the current derivatives the diagnostic algorithm can use the simple calculation of the engagement time T1 of the movable core, and possibly the time (T2–T1) employed by the movable core to carry out its stroke, for example by using one of the techniques described above. In particular, a single current peak detection circuit of the type described in FIG. 5 may also be used, also partially integrated in the diagnostic microcontroller.

In one embodiment, after the solenoid current has been brought to full capacity, the microcontroller also monitors the value of the resistance R of the solenoid, for example by calculating the mean value of the ratios between the voltage and the current, so as to detect short-circuit, open circuit conditions or other abnormal situations, due for example to overheating of the solenoid valve, to be communicated to the PLC.

In particular, according to an embodiment, the microcontroller calculates the value R0 of the solenoid resistance R at the first start-up of the solenoid valve, that is to say, with a still cold solenoid valve. The microcontroller then monitors the resistance value during the solenoid valve working cycle and compares it to a predetermined limit value R1 defined by an admissible heating of the solenoid (step 314). If the resistance value increases, but remains lower than the predetermined value R1, then no anomalies are detected.

If, on the other hand, the value of the solenoid resistance R is greater than the predetermined value R1, an open circuit may have occurred in the solenoid valve, in which case the microcontroller sends an error signal (step 316), or an abnormal overheating, in which case the microcontroller sends an alarm signal (step 318).

If, on the other hand, the value of the solenoid resistance R decreases with respect to the initial value R0, then an anomaly has occurred and the microcontroller sends an alarm signal (step 320).

It should be noted that, depending on the type and severity of the detected malfunction, for example solenoid valve wear, short circuit or open circuit of the solenoid, the messages sent by the microcontroller may be alarm messages, resettable by the PLC, or error messages, which lead, for example, to the direct stop of the solenoid valve.

Of course, the calculation of the solenoid resistance value R assumes a constant supply voltage.

Figure 10:
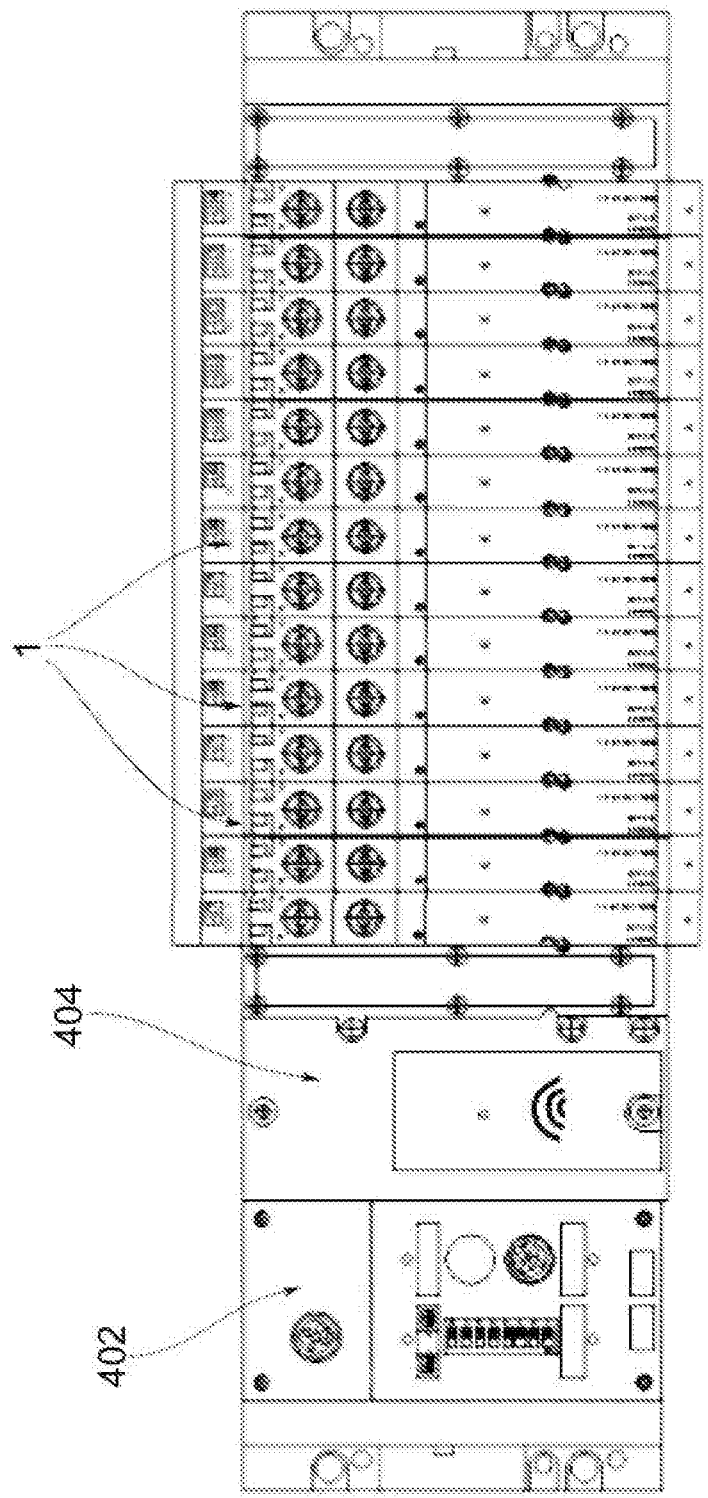
FIG. 10 is a plan view of a valve island provided with a diagnostic and communication device according to the invention.

In the case of an island of valves 400, as illustrated in FIG. 10, the diagnostics can be performed on the individual solenoid valves 1 or on the entire island, i.e. monitoring the waveform of the current common to all the solenoid valves and analyzing variations with respect to the average value. It is therefore possible to determine the behavior of the solenoid valves by controlling the time elapsing between the energization of each solenoid valve and the variation present on the reference common of the solenoid valves.

In order for a diagnosis to be performed on the single solenoid valve, the diagnostic algorithm must provide for an energization of the solenoid valve in question in a time interval that is not concurrent with other events, for example in which the other solenoid valves are not energized.

Alternatively, the diagnostic algorithm can establish a steady state condition for groups of solenoid valves of the valve island, so as to detect anomalous absorption conditions of each group of solenoid valves with respect to a set of predetermined or preacquired values for that same operating situation of the relative group.

In the case of valve island 400, the diagnostic methods described above may provide for communication with an external control unit, for example a PLC, or may instead provide communication of the outcome of the diagnostic activity to the electronic board 402 which controls the valve island and is integrated into the island itself. For example, such an electronic board 402 may be provided with a series of signaling LEDs suitable for displaying the various causes of malfunctioning of the valve island.

In the case of communication with an external control unit, a diagnostic, wired or wireless communication protocol may be provided. In this case, the microcontroller and the transmitter/receiver module 404 may be installed on the same electronic circuit board 402 for powering and controlling all the solenoid valve of the valve island.

Also in the case of connection between the diagnostic circuit of a single solenoid valve and an external control unit, the aforementioned diagnostic cable could be replaced by a wireless communication system, depending on the needs and the available technology.

A man skilled in the art may make several changes, adjustments, adaptations and replacements of elements with other functionally equivalent ones to the embodiments of the diagnostic device and method for solenoid valves according to the invention in order to meet incidental needs, without departing from the scope of the following claims. Each of the features described as belonging to a possible embodiment can be obtained independently of the other embodiments described.

What is claimed is:

1. A diagnostic method for diagnosing a malfunction in a solenoid valve, wherein the solenoid valve comprises an electromagnet and a valve body, wherein one or more orifices are provided for passage of a pressurized fluid, and wherein the electromagnet comprises a solenoid drivable by a solenoid current and a magnetic circuit comprising a movable core situated and slidable in the solenoid, the diagnostic method comprising the steps of:
   a) storing, in a non-volatile memory register, reference features of a solenoid current waveform;
   b) detecting features of the solenoid current waveform during operation of the solenoid valve;
   c) comparing the reference features with the detected features; and
   d) generating an alarm signal for malfunction of the solenoid valve, in an event of a deviation between values of the detected features and values of the reference features,
   wherein step d) further comprises, before generating the alarm signal, the steps of:
      comparing a pressure value of fluid entering an inlet orifice of the solenoid valve with a predetermined pressure value range; and
      adjusting the pressure value and repeating steps b) and c), in an event of deviation of the pressure value with respect to the predetermined pressure value range,
   the alarm signal being generated in the event of the deviation between the values of the detected features and the values of the reference features and the deviation between the pressure value and the predetermined pressure value range.

2. The method of claim 1, wherein the features of the solenoid current waveform that are stored and compared are a slope of a first waveform section between an instant of excitation of the solenoid valve and a first current peak generated by engagement of the movable core and a slope of a second waveform section between the first current peak and a next minimum point of a value of the solenoid current.

3. The method of claim 2, further comprising the steps of:
   checking whether the solenoid current waveform has, after the first current peak and before reaching the next minimum point, an inflection point and/or further minimum and maximum relative points;
   calculating average values of a current derivative over time in a time interval immediately preceding and in a time interval immediately following the inflection point or relative minimum point;
   comparing the average values of the current derivative with corresponding reference values; and
   checking whether at least one of the average values of the current derivative is, in absolute value, lower than the corresponding reference value.

4. The method of claim 3, wherein presence of the inflection point and/or of the further maximum and minimum relative points is detected by calculating a derivative of the current over time and verifying whether the derivative of the current over time assumes a null or positive value in two instants of time in a time interval following an instant in which a waveform peak occurs and before the solenoid current reaches a steady state value.

5. The method of claim 1, wherein the features of the solenoid current waveform comprise at least a first time interval that elapses between an instant of excitation of the solenoid and an instant of a current peak generated by engagement of the movable core.

6. The method of claim 5, wherein the first time interval is obtained by an analog peak detection circuit that compares the value of an instant solenoid current with a value of the solenoid current to which a predetermined delay is applied, or by a digital sampling circuit of the solenoid current waveform.

7. The method of claim 1, wherein the reference features are features of the solenoid current waveform acquired when the solenoid valve is in a test phase during or after release from a factory.

8. The method of claim 1, wherein the reference features are features of the solenoid current waveform obtained from average values relative to a set of values previously acquired.

9. A diagnostic device for diagnosing the malfunction in the solenoid valve, wherein the diagnostic device comprises an electronic diagnostic circuit with a microcontroller configured to implement the diagnostic method of claim 1.

10. The device of claim 9, wherein the electronic diagnostic circuit is implemented on a power supply and control circuit board configured to be mounted on the solenoid valve.

11. The device of claim 9, further comprising communication means to implement communication between the microcontroller of the electronic diagnostic circuit and an external control unit.

12. The device of claim 11, wherein said communication means transmit a status signal to the external control unit, which may assume at least two logical levels representative of an operational state of the solenoid valve.

13. The device of claim 9, wherein the electronic diagnostic circuit comprises a current sampling circuit to sample the solenoid current waveform at predetermined time intervals.

14. The device of claim 9, wherein the electronic diagnostic circuit comprises an analog peak detection circuit comprising an operational amplifier with comparator function, an inverting input terminal of which receives the solenoid current detected through a shunt resistor and a non-inverting input terminal of which receives the solenoid current to which is applied a delay given by an RC network.

15. A solenoid valve comprising the diagnostic device of claim 9.

16. The solenoid valve of claim 15, further comprising a power supply and control circuit board, the diagnostic device being implemented on the power supply and control circuit board.

17. The solenoid valve of claim 16, wherein the power supply and control circuit board is provided with an electrical connector having a pair of power supply terminals and an electrical diagnostic terminal connectable to an external control unit.

18. A solenoid valve island, comprising a plurality of solenoid valves and a power supply and control circuit board for all solenoid valves of the valve island, said power supply and control circuit board comprising an electronic diagnostic circuit with a microcontroller configured to implement the diagnostic method of claim 1, wherein the reference features are related to each of the solenoid valves of the valve island or groups of solenoid valves of the solenoid valve island, and wherein the detected features are obtained by exciting separately each solenoid valve or each group of solenoid valves.

* * * * *